US011501475B2

(12) United States Patent
Hoover

(10) Patent No.: US 11,501,475 B2
(45) Date of Patent: Nov. 15, 2022

(54) GRAPHICAL REPRESENTATION OF ELECTRONIC CIRCUIT OPERATION

(71) Applicant: Steven F. Hoover, Shrewsbury, MA (US)

(72) Inventor: Steven F. Hoover, Shrewsbury, MA (US)

(73) Assignee: Steven F. Hoover, Shrewsbury, MA (US)

( * ) Notice: Subject to any disclaimer, the term of this patent is extended or adjusted under 35 U.S.C. 154(b) by 0 days.

(21) Appl. No.: 17/330,794

(22) Filed: May 26, 2021

(65) Prior Publication Data

US 2021/0375014 A1 Dec. 2, 2021

Related U.S. Application Data

(60) Provisional application No. 63/029,988, filed on May 26, 2020.

(51) Int. Cl.
*G06T 11/20* (2006.01)
*G06F 30/3308* (2020.01)
*G06F 30/38* (2020.01)

(52) U.S. Cl.
CPC ........ *G06T 11/206* (2013.01); *G06F 30/3308* (2020.01); *G06F 30/38* (2020.01)

(58) Field of Classification Search
CPC ........ G06T 11/206; G06F 30/30; G06F 30/31; G08B 21/0219
See application file for complete search history.

(56) References Cited

U.S. PATENT DOCUMENTS

| | | | | |
|---|---|---|---|---|
| 6,530,065 B1 * | 3/2003 | McDonald | ............ | G06F 30/367 716/102 |
| 7,822,590 B2 * | 10/2010 | Kundert | ................ | G06F 30/367 703/14 |
| 9,928,318 B1 * | 3/2018 | Kukal | ..................... | G06F 30/33 |
| 2004/0054296 A1 * | 3/2004 | Ramseth | ................ | G16H 40/40 600/509 |

* cited by examiner

*Primary Examiner* — Michelle L Sams
(74) *Attorney, Agent, or Firm* — Pierce Atwood LLP

(57) ABSTRACT

A system displays a visual representation of the operation of an electronic circuit. The position of graphical elements representing values of signals in the circuit convey information about the operation of the circuit. The visual representation may further depict navigable levels of hierarchy of the electronic circuit.

16 Claims, 13 Drawing Sheets

Visualization Display Data 420b

Graphical Element 406b (viz_a)

Graphical Element 410b (viz_c)

Model Data 402a sig_a = x
sig_b = y
sig_c = x AND y

Visualization Data 404a viz_a ← sig_a
viz_b ← sig_b
viz_c ← sig_c
1=black; 0=white
position = " → "

Graphical Element 408b (viz_b)

Waveform Display Data 422b sig_a
sig_b
sig_c

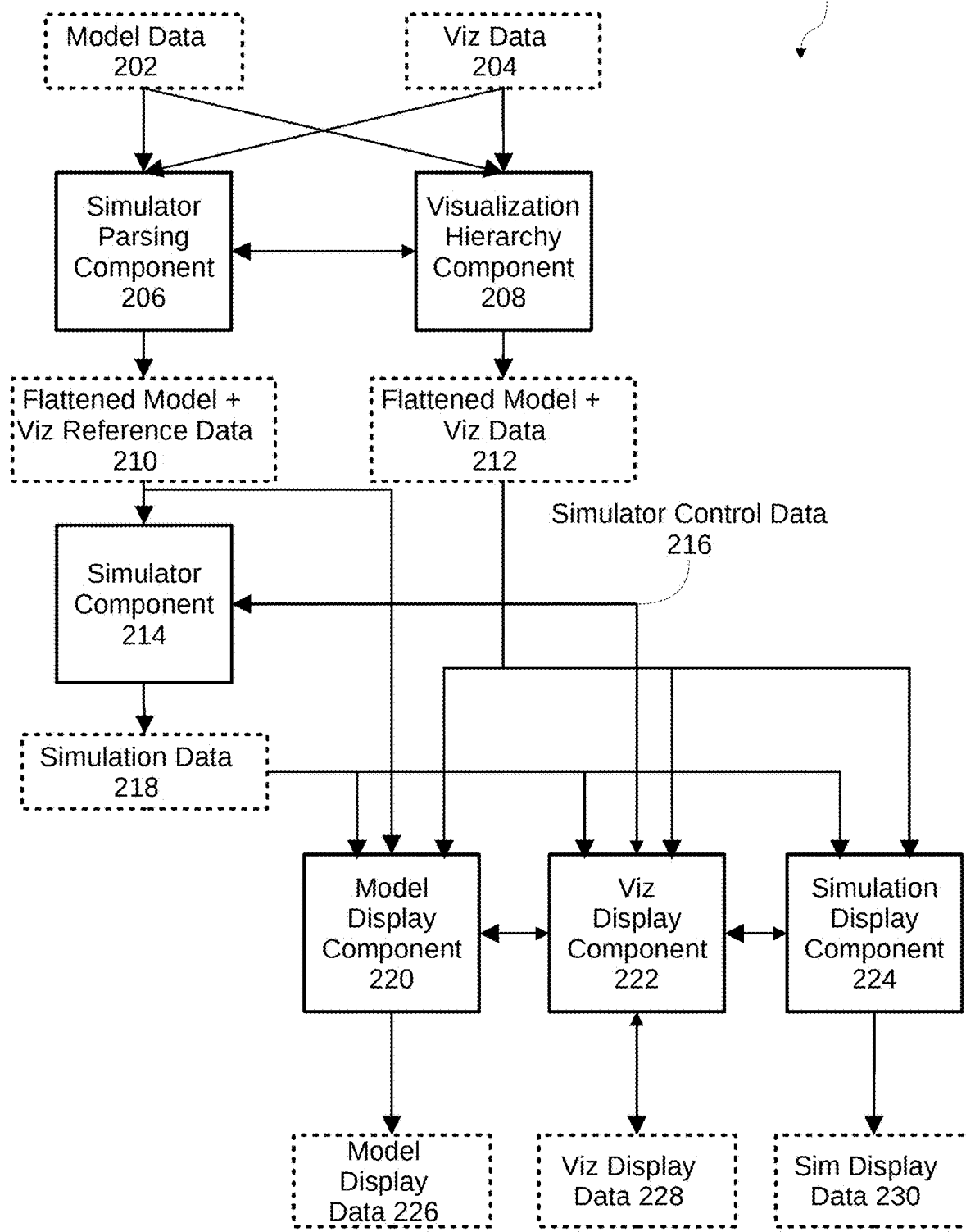

FIG. 4A

Model Data 402a sig_a = x
sig_b = y
sig_c = x AND y

Visualization Data 404a viz_a ← sig_a
viz_b ← sig_b
viz_c ← sig_c
1=black; 0=white
position = "→"

FIG. 4B

Visualization Display Data 420b

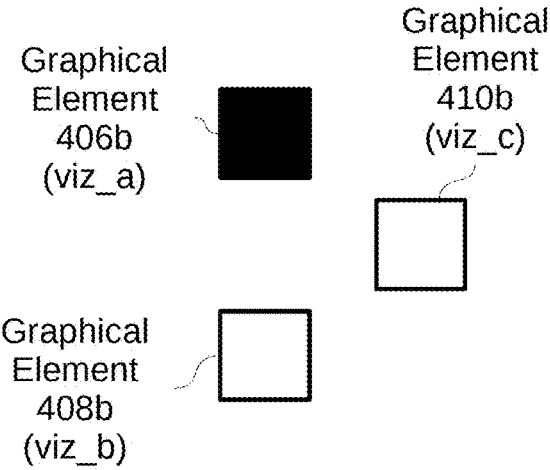

Graphical Element 406b (viz_a)

Graphical Element 410b (viz_c)

Graphical Element 408b (viz_b)

FIG. 4C

Visualization Display Data 420c

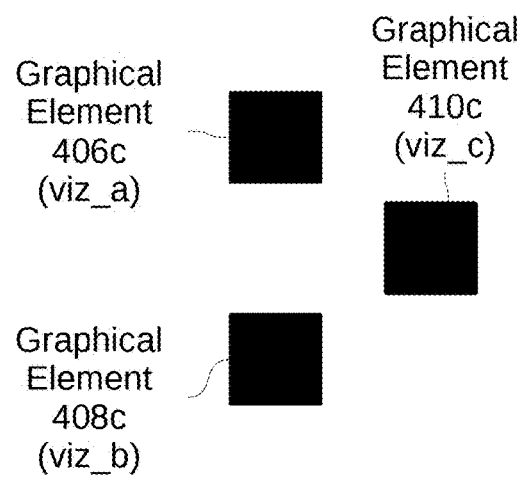

Graphical Element 406c (viz_a)

Graphical Element 410c (viz_c)

Graphical Element 408c (viz_b)

Waveform Display Data 422b

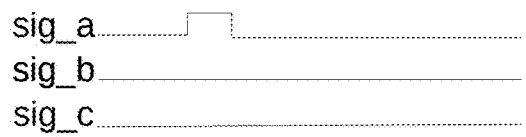

Waveform Display Data 422c

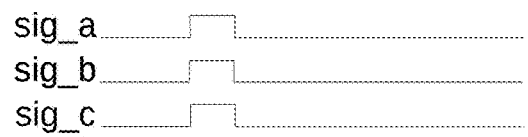

FIG. 4D
Model Data 432d
sig_a = w
sig_b = x
sig_c = y
sig_d = z
sig_e = (w OR x)
    OR (y OR z)
Visualization Data 434d
viz_a ← sig_a
viz_b ← sig_b
viz_c ← sig_c
viz_d ← sig_d
viz_e ← sig_e
1=black; 0=white
position = "→"
FIG. 4E
Visualization Display Data 440a
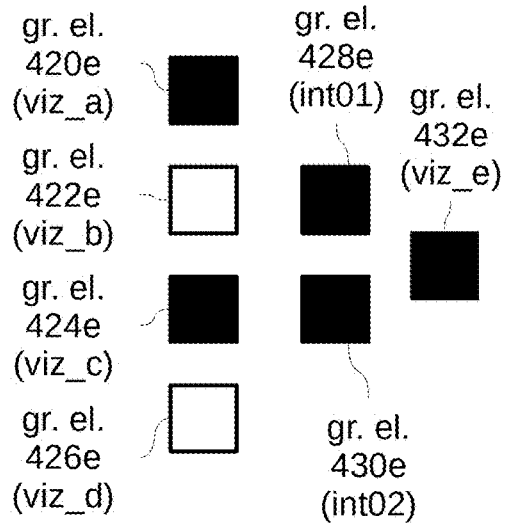
Waveform Display Data 442e
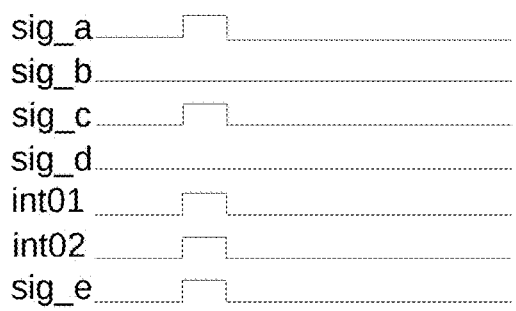
FIG. 4F
Visualization Display Data 440b
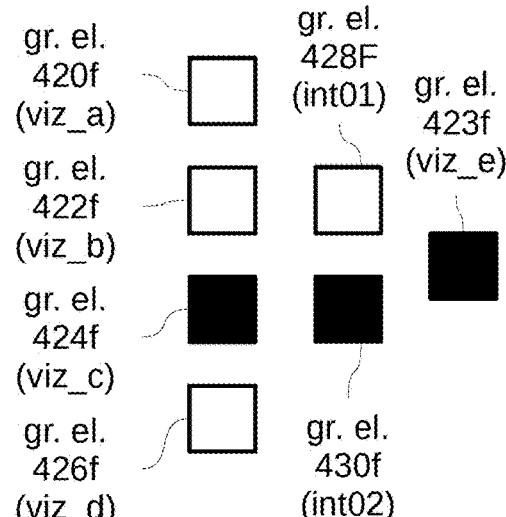
Waveform Display Data 442f
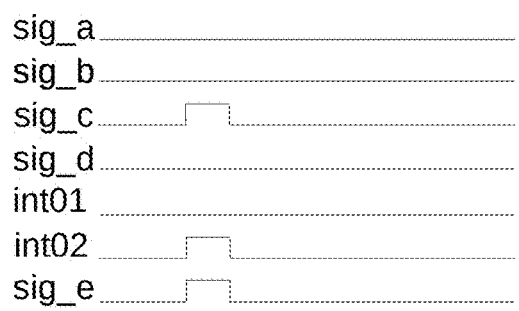

FIG. 5A
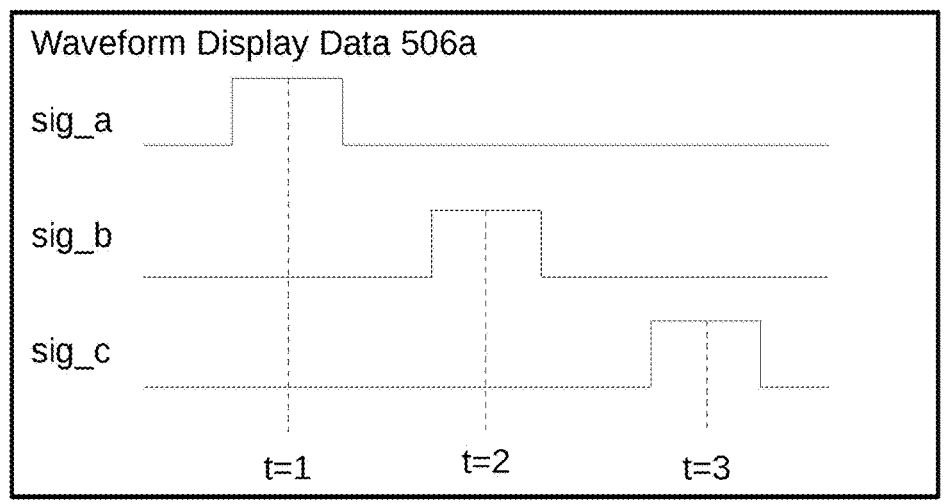
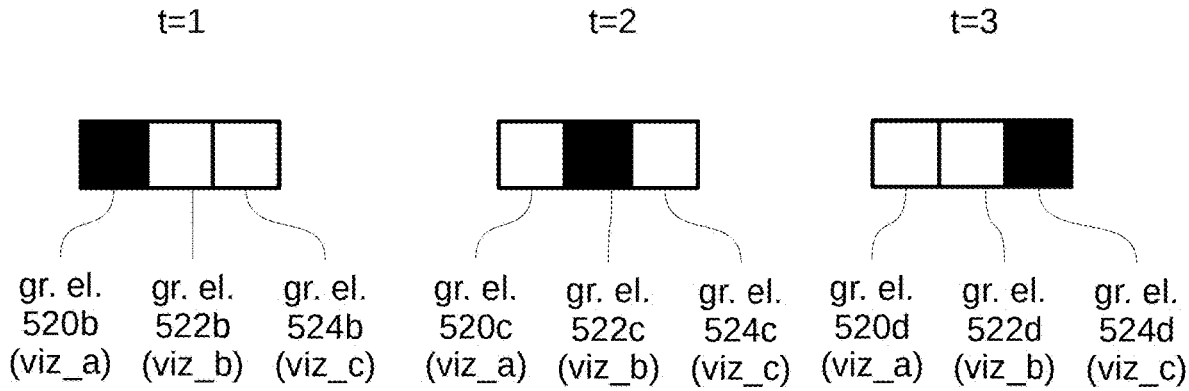
FIG. 5B      FIG. 5C      FIG. 5D

GRAPHICAL REPRESENTATION OF ELECTRONIC CIRCUIT OPERATION

CROSS-REFERENCE TO RELATED APPLICATION

This application claims priority to and the benefit of, and incorporates by reference herein in its entirety, U.S. Provisional Patent Application Ser. No. 63/029,988, filed May 26, 2020, in the name of Steven F. Hoover.

BACKGROUND

Electronic circuits may include transistors, resistors, capacitors, inductors, and/or other similar elements; these elements may be used to create other elements, such as logic gates and functional blocks. Operation of said circuits may be determined by applying electric signals to physical circuits, by applying simulated signals to models of circuits, or by other such means. The operation may include applying signals to input nodes and determining corresponding voltages and/or currents on intermediate and/or output nodes. The determined voltages and/or currents may be depicted as numeric values, as Boolean values, or as waveforms.

BRIEF DESCRIPTION OF DRAWINGS

For a more complete understanding of the present disclosure, reference is now made to the following description taken in conjunction with the accompanying drawings.

FIGS. 2A and 2B illustrate systems for displaying data representing operation of an electronic circuit according to embodiments of the present disclosure.

FIGS. 4A, 4B, 4C, 4D, 4E, and 4F illustrate displaying data representing operation of an electronic circuit according to embodiments of the present disclosure.

FIGS. 5A, 5B, 5C, and 5D illustrate displaying data representing operation of an electronic circuit at least two points in time according to embodiments of the present disclosure.

DETAILED DESCRIPTION

Figure 1:
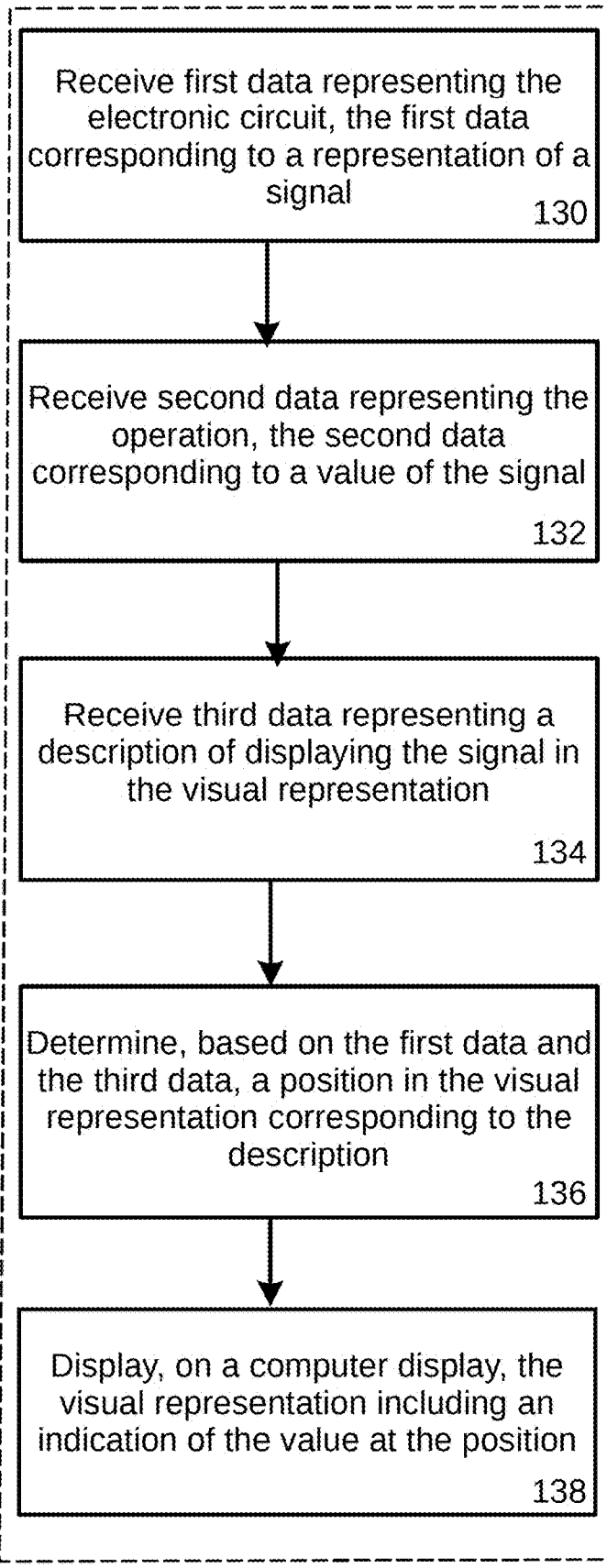
FIG. 1 illustrates a method for displaying data representing operation of an electronic circuit according to embodiments of the present disclosure
Figure 1:
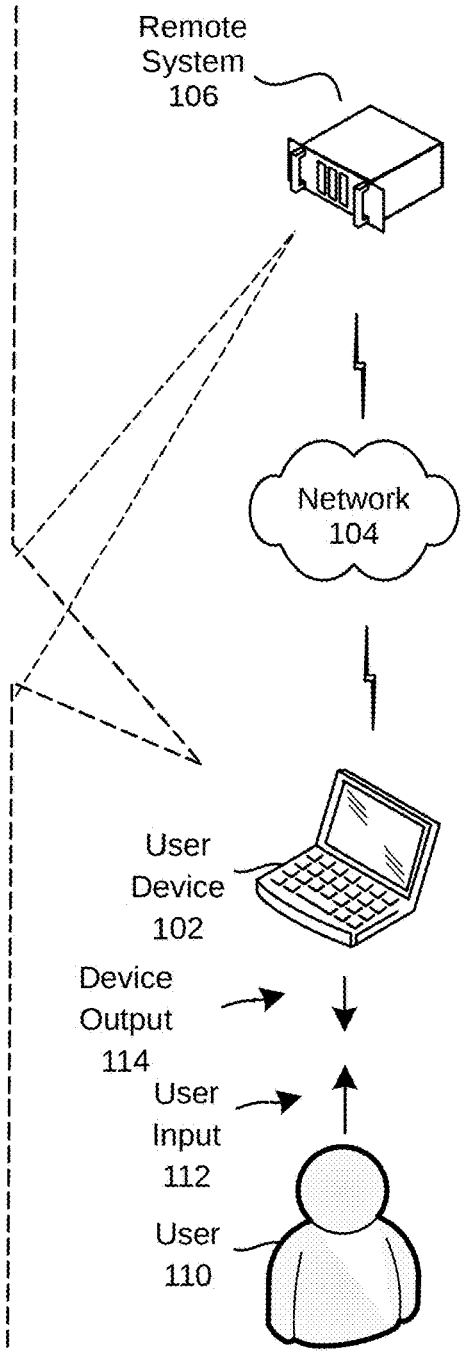

The present disclosure relates to displaying data representing operation of an electronic circuit, such as displaying, on a computer display, simulated circuit behavior determined by software relating to circuit-modeling techniques. The present disclosure thus relates to, but is not limited to, the field of electronic design automation (EDA) and/or integrated development environments (IDEs) for electronic circuit modeling, simulation, debugging, and/or verification. The electronic circuits may include digital circuits, analog circuits, mixed-signal circuits, and/or other types of circuits.

Techniques for debugging complex electronic circuits may include using a computer model of the electronic circuit to simulate the circuit. The computer model may be written in a modeling computer language, such as a hardware description language (HDL). A circuit model may be represented in several ways, including HDL source code and/or schematic-style diagrams of HDL logic. State machines, such as Mealy and Moore machines, may be used as modeling constructs; these may be represented as directed graph diagrams. Block diagrams may further be used to represent hierarchy and/or interconnectivity.

Input data to the computer model may specify the behavior of input signals, such at which times a particular input signal is represented by a logical "0" or a logical "1." Operation of the computer model includes applying the specified input signals to one or more elements of the model, determining the outputs of those elements, and similar processing of those outputs by additional elements. The output data of the computer model may be stored in computer data, such as a text data file and/or trace data file. The computer model may be interactive, and may simulate only portions of the model and/or only certain periods of time of operation of the model per user (and/or other) control input.

Waveform viewers may be used to represent model output data, such as signal traces, as signal waveforms. Waveform viewers may be categorized as timeline views, where time is represented on one of the two axes of the two-dimensional display, and the state of the model is represented on the other axis. A state view may be used to represent machine state at a point in time. State viewers may provide interactive controls to allow a user to adjust which period of time is displayed. In synchronous logic, controlled by a clock, time may be expressed discretely as clock cycles. Timeline views and state views are not a mutually exclusive categorization. More generally, state views may represent a window of time in the neighborhood of a reference time. A timeline view with a reference time, such as a waveform view with a cursor (vertical line at the reference time), can also be considered a state view.

Text output, from, for example, print statements in the HDL model, may be used to display the outputs of the model. This approach may be easy to develop, easy to search, and viewable without special tools. Because print statements may have access only to the current state of the simulated model, this form of display of model data may be limited in its ability to represent behavior.

The outputs of the model may further be used to represent simulation behavior as a state view by, for example, annotating displayed wires/arcs with values from simulation. Unlike waveform viewers, these representations do require knowledge of the model, not just the signal trace.

As designs scale in complexity, traditional methods of representing digital circuit simulations thus retain a literal, signal-level view of circuit behavior, limited by what tools can automatically extract from hardware models and simulation traces. They have a limited ability to represent behavior in other, less literal ways, and this contributes to unsustainable trends in the overall effort required to develop and debug new ICs as complexity increases. Systems and methods of visualizing simulations in different ways, such as the systems and methods described herein, are thus needed.

Embodiments of the present disclosure thus relate to systems and methods for displaying data representing operation of an electronic circuit. This data, which is also referred to herein as a visualization of the operation, may permit the display of data representing operation that conveys information via position of graphical elements on a computer display (and/or in a window of a computer display). Other visual aspects of the graphical elements, such as shape or color of the elements, may similarly convey information. For example, elements of a first-in-first-out buffer may be displayed as graphical elements adjacent to each other, in which neighboring elements of the FIFO buffer may be displayed as adjacent graphical elements. Further, an element of the FIFO that holds a non-zero value may be depicted as a graphical element using a first color (e.g., black), and another element of the FIFO that holds a zero value may be depicted as a graphical element using a second color (e.g., white). The identification and position of the graphical elements may be wholly or partially determined by user input, herein referred to as viz data, which may be a textual or code-based (e.g., HTML) description of the position(s). The viz data may further specify additional information about the graphical elements, such as which colors correspond to which signal values.

Referring to FIG. 1, a user 110 may provide input data, such as input data 112, to a user device 102, which may be a display-enabled user device (e.g., a device featuring at least one display, such as a smartphone, tablet, or personal computer). The input user data 112 may include one or more user gestures directed to the user device, such as a touchscreen input, mouse click, or key press. The user device 102 may output device output 114 corresponding to, for example, displaying information on the computer display. The user 110 may provide, as input data, data describing an electronic circuit, such as model data, and/or data describing a visual representation of operation of the circuit. As described in greater detail herein, this data may include positions of graphical elements that indicate a value of one or more signals corresponding to the circuit. This data may further include other aspects of the graphical elements, such as their color, size, and/or shape.

In various embodiments, a computer-implemented method for displaying data representing operation of an electronic circuit includes receiving (130), by the user device 102 and/or remote system 106, first data representing an electronic circuit, the first data corresponding to a representation of a signal. The first data may be, for example, a computer-language description of a model of an electronic circuit, such as HDL code.

The user device 102 and/or remote system 106 may receive (132) second data representing the operation, the second data corresponding to at least one value of at least one signal. The second data may be, for example, output data of a circuit simulator that processes, using some or all of the first data, signal input data to produce output data that represents the operation of the electronic circuit. The output data may be or include, for example, values of signals corresponding to the operation of the electronic circuit at one or more points in time. The values may be binary values (e.g., 0s and 1s) representing voltages or currents, analog currents or voltages, letters or symbols representing voltages or currents, or other such values. The points in time may correspond to divisions of 1 second, millisecond, nanosecond, picosecond, or other such division. The second data may instead or in addition be data obtained from operation of an actual hardware circuit that corresponds to the model, a verification tool processing the model, and/or from any other source. The present disclosure is not limited to any particular source of the second data.

The user device 102 and/or remote system 106 may receive (134) third data representing a description of displaying a graphical element representing the signal (and/or the value of the signal) in the visual representation of the operation. The third data may be, for example, text data or similar data, such as HTML code, that describes the display of the operation of the electronic circuit. This description may include indications of one or more signals to be included in the visualization, indications of one or more positions of graphical elements representing values of the signals, and/or indications of colors of the values. The third data may be determined by the user 110 and/or by the user device 102 and/or remote system 104. In various embodiments, the first data and the third data may be separate or wholly or partially combined in one or more computer-readable media.

The user device 102 and/or remote system 106 may determine (136), based on the first data and the third data, a position in the visual representation of the operation corresponding to the description. In some embodiments, the user device 102 and/or remote system 106 may determine a position based on the third data. This position may include an (x,y) position on an computer display (and/or in a window displayed on a computer display) that indicates where on the display the graphical element corresponding to a value of a signal appears. This position may be determined using user input and/or determined by processing the model and/or simulation data, as described in greater detail below.

The user device 102 and/or remote system 106 may display (138), on a computer display, the visual representation of the operation including an indication of the value at the position. This indication may correspond to a graphical element, as described herein. As described in greater detail herein, the visual representation may include additional indications of values of signals and/or may include indications that correspond to different points in time. The visual representation may further display operation of the circuit at a first point in time and at a second point in time. A user input corresponding to a graphical element may display or otherwise indicate corresponding aspects of the model in the model data and/or aspects of the simulation in the simulation data.

Figure 2A:
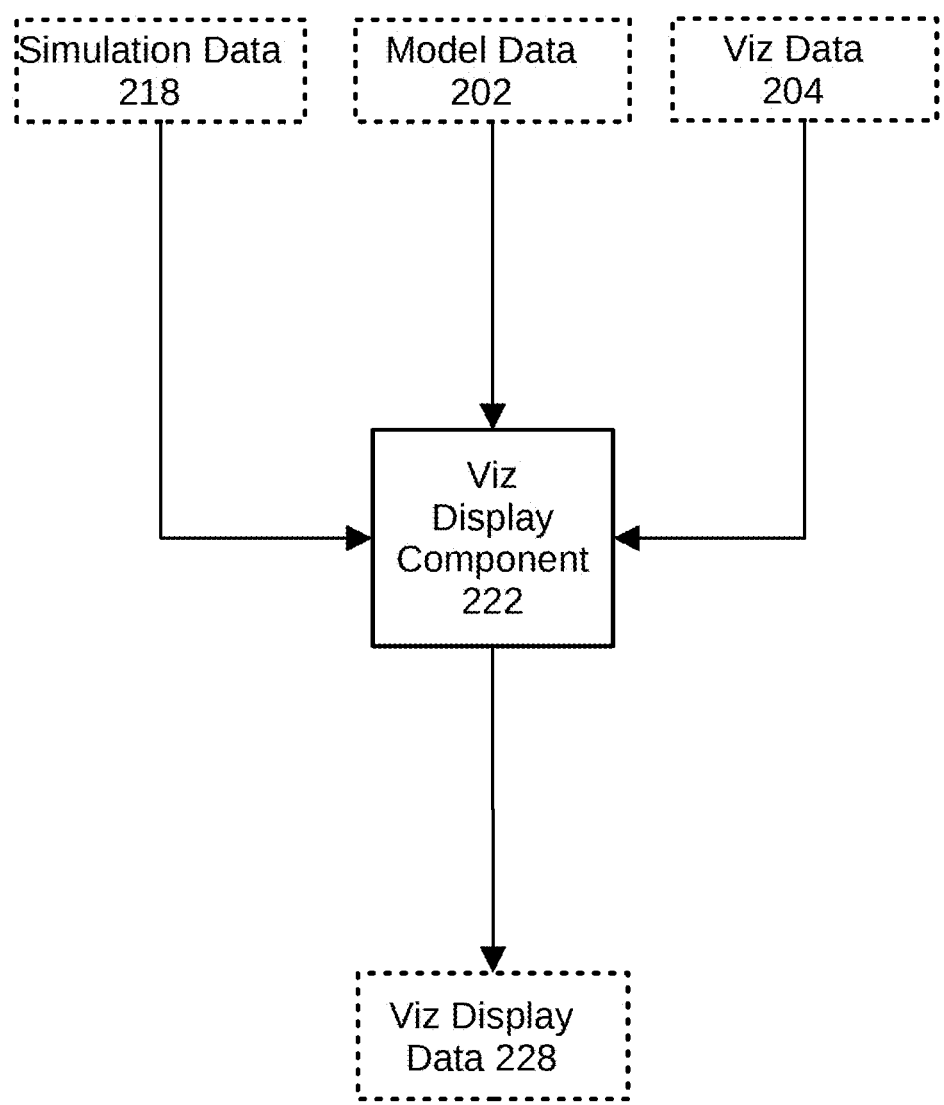

FIGS. 2A and 2B illustrate systems 200a, 200b for displaying data representing operation of an electronic circuit. Referring first to FIG. 2A, a visualization display component 222 receives first data, which may be model data 202 and may include a representation of at least one signal, such as an input, output, or internal node of a transistor-based circuit, such as a logic gate, adder, multiplier, or other such circuit. The model data 202 may further include descriptions of transistors, logic gates, or other such structures that operate on signals. The visualization display component 222 may further receive second data, which may be simulation data 218, which may include at least one value of a signal (e.g., 0 or 1) at a certain point in time of operation of the circuit. The visualization display component 222 may further receive third data, which may be viz data 204, which may include a description of displaying the signal (via, for example, a description of a graphical element representing the signal).

The visualization display component 222 may thus process at least the simulation data 218, model data 202, and/or visual data 204 to determine visual display data 228, which may be caused to be displayed on a computer screen. Further details of the operation of the visual display component 222 are explained below with reference to FIG. 3.

Referring to FIG. 2B, a system 200b includes a simulator parsing component 206 that may process the model data 202 (and, in some embodiments, the visual data 204) to determine flattened model and visual reference data 210, and a visualization hierarchy component 208 may process the model data 202 and/or visual data 204 to determine flattened model and visual data 212, which may include visual data and/or hierarchy data. Though illustrated as separate blocks, the simulator parsing component 206 and the visualization hierarchy component 208 may share some or all of their processing. Flattening, which may also be referred to as elaboration, refers to a process of replacing and/or expanding module instances of portions of the model with corresponding model definitions, unrolling loops, expanding arrays of modules, etc. This replacing and/or expanding process may or may not remove hierarchy information; the flattened model and visual data 212 may thus include hierarchy data. This replacing and/or expanding of components at a first level of hierarchy may create a second, lower level of hierarchy that includes additional details of the flattened components. For example, a portion of the model initially defined as Loop[0:1] and associated with a logic block A may be flattened into a first Loop[0] associated with a first logic block A[0] and a second Loop[0] associated with a second logic block A[0]. The first level of hierarchy may correspond to the Loop[0:1] component, and the second level of hierarchy may correspond to the Loop[0] and Loop[1] components. The model data 202 need not include, however, any components that require flattening.

The flattened model and visual reference data 210 may further include associations (which may be denoted herein by the term "viz") between one or more signals in the model data 202 and one or more graphical elements in the visual data 204. For example, the visual data 204 may include an association of the form sig_a←viz_a, indicating that a signal "sig_a" is associated with a graphical element corresponding to "viz_a." During flattening, this single association may be replicated if "sig_a" is associated with a loop, module, array, or other such component that gets flattened into multiple components. In other embodiments, this single association may be used to refer to the unflattened element(s). In other words, a single graphical element may be associated with the unflattened Loop[0:1] and/or two graphical elements may be associated with each flattened Loop[0] and Loop[1].

The flattened model and visual data 212 may include information representing to which level a hierarchy a given graphical element is associated with. The levels of hierarchy may be determined by the visualization hierarchy component 208 by processing the model data; a first component may have a first level of hierarchy, and a second component referred to within the first component may have a second, lower level of hierarchy. These levels of hierarchy and associated signals may be represented in the flattened model and visual data 212.

As explained in greater detail below with reference to FIG. 7A, different levels of hierarchy may be displayed in response to, in some embodiments, user input. The user input may correspond to a particular graphical element and thus display a different level of hierarchy corresponding to that input. In other embodiments, the user input corresponds to a request to view a different level of hierarchy that does not necessarily correspond to a particular graphical element (by, e.g., use of a scroll bar or mouse wheel).

A simulator component 214 may process the flattened model and visual reference data 210, model data 202, and/or visual data 204 to determine simulation data 218, which may be a digital representation of the operation of the electronic circuit. The simulator component 214 may thus include a computer model of the electronic circuit capable of processing the input data, modeling individual elements of the electronic circuit, and determining outputs. For example, the computer model may include a software model of an AND gate that is associated with operational parameters, such as its Boolean function and input-to-output timing, and apply these parameters to received input signals to determine the value and timing of the output signal. The simulator component 214 may similarly process other signals using other similar components. Any method of simulating operation of an electronic circuit is, however, within the scope of the present disclosure. In some embodiments, the simulation data 218 is determined by measuring values of signals of a real (e.g., non-simulated circuit); in these embodiments, the simulator component 214 may not be used to generate the simulation data 218.

In some embodiments, the simulation data 218 includes values for all signals associated with the model for one or more points in time at which operation of the model is simulated. In other embodiments, the simulation data 218 includes values for only signals indicated by the visual data 204. In still other embodiments, the simulation data includes values for signals indicated by the visual data 204 in addition to other values of related signals, such as internal signals.

The simulator component 214 may determine all the simulation data 218 for a determined period of time. In some embodiments, the visual display component 222 may receive, as user input, simulator control data 216 that specifies particular periods of time for operation of the simulator. The simulator control data 216 may further specify that only portions of the model (corresponding to only portions of the circuit) should be simulated.

As described herein, the visual display component 222 processes at least the simulation data 218 to determine the visual display data 228. The visual display data 228 may include an electronic representation of a visual representation of operation of the circuit, including the graphical elements described herein, as well as other user-interface graphical elements, for display on an electronic display. The present disclosure is not limited to any particular system or method for displaying data on a computer display, and any type of display or means of display thereon is within its scope.

As also described herein in greater detail, the system 200b may include other components that may display other information about the model and/or simulation. A model display component 220, for example, may process the data 212 to determine model display data 226. This model display data 226 may include a representation of computer code defining the model (e.g., HDL code), a block diagram visually representing the model, or other such information. A simulation display component 224 may similarly process the simulation data 218 to determine simulation display data 230. The simulation display data 230 may similarly include a representation of the simulation data 218, which may include a representation of signal waveforms (such as those shown in FIG. 4E). The present disclosure is not limited to any particular system or method for displaying the model display data 226 and/or the sim display data 230 on a computer display, and any type of display or means of display thereon is within its scope.

As described in greater detail below with reference to FIGS. 6A and 6B, the visual display data 228 (and/or the model reference data 210 and/or the data 212) may include associations between a graphical element represented in the visual display data 228 and one or more items of data, such as values of signals, in the model display data 226 and/or the sim display data 230. The visual display component 222 may determine that a user input corresponds to a particular graphical element represented in the visual display data 228 and may thus determine, based on the corresponding association, the one or more items of data in the model display data 226 and/or the sim display data 230. The visual display component 222 may thus send an indication of the association to the model display component 220 and/or the simulation display component 224, which may then highlight or otherwise indicate the corresponding item of data. For example, when the visual display component 222 determines a user input that corresponds to a particular graphical element, it may cause the model display component 220 to highlight a corresponding line of code and/or cause the simulation display component 224 to highlight a corresponding waveform.

Figure 3:
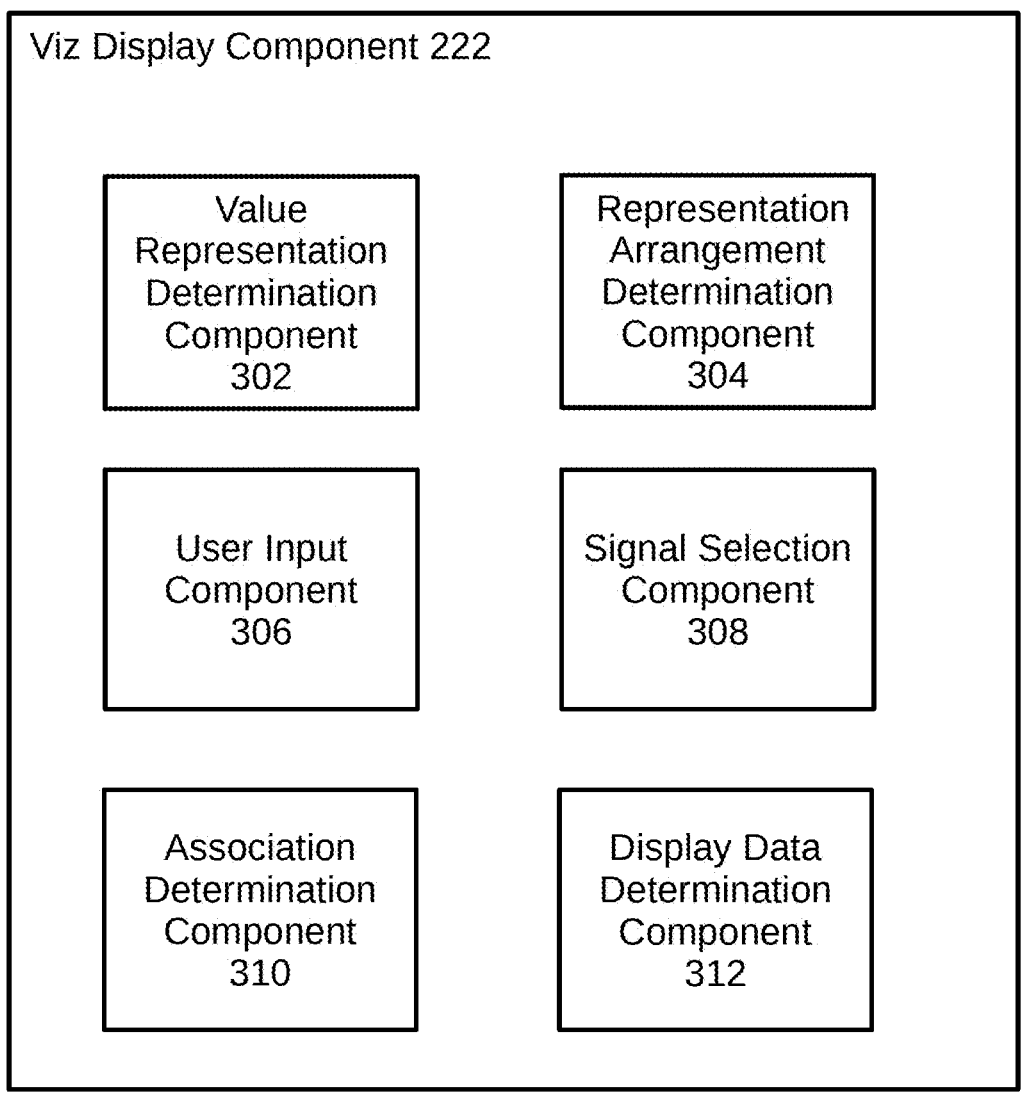
FIG. 3 illustrates details of a system for displaying data representing operation of an electronic circuit according to embodiments of the present disclosure.

FIG. 3 illustrates details of a visual display component 222 for displaying data representing operation of an electronic circuit according to embodiments of the present disclosure. The visual display component 222 is not limited to only these particular components, and other arrangements and combinations of components are within the scope of the present disclosure.

A value representation determination component 302 may determine, using user data and/or the visual data 204 and/or model data 202 (and or data 210/212 derived therefrom), a visual representation of one or more values corresponding to one or more signals. The value representation determination component 302 may, for example, determine to display values on the computer display as one or more shapes, such as squares, rectangles, circles, or other such shapes. The value representation determination component 302 may similarly determine colors that correspond to certain values, such as black for a binary 1 and white for a binary 0. This determination may correspond to a description of said shapes in the visual data 204 (e.g., as determined by a user), by referencing default values, and/or by randomly assigning shapes and/or colors from a library of shapes and colors. Any method of assigning shapes and colors is, however, within the scope of the present disclosure.

The present disclosure is not limited, however, to only binary signals and digital logic. The simulation data 218 may include references to other kinds of values, such as analog voltages. In these embodiments, the value representation determination component 302 may determine to display a range of analog values (between, for example, 0.0 volts and 1.0 volts) as a spectrum of colors between two colors (for example, black and white).

Similarly, the value representation determination component 302 is not limited to displaying only a one-to-one correspondence between a single value and corresponding signal and a graphical element. A group of signals may correspond to a bus, for example, such as an 8-bit bus referenced as BUS[7:0]. The value representation determination component 302 may determine to display a graphical element that, for example, displays a spectrum of color that depends on the number of values of the signals of the bus that are binary 1s.

The present disclosure is similarly not limited to graphical elements that correspond only to shapes and corresponding colors. Other visual elements capable of depicting signal values, such as slider bars, thermometers, and dials are within the scope of the present disclosure.

The value representation determination component 302 may similarly determine to depict a value using a size of the corresponding shape of the graphical element, instead of or in addition to the color of the graphical element. The graphical element may, for example, be larger when its corresponding value is a binary 1 and smaller when its corresponding value is a binary 0.

A representation arrangement determination component 304 may determine the positions on a computer display at which to display the various graphical elements. The positions may similarly be represented by user data; the user data, may include a description of the placement of each associated graphical element. This description may be an absolute or relative (x,y) position assigned to each graphical element or to a group of graphical elements. Relative positions include, for example, whether a first graphical element should be positioned above, below, to the left, or to the right of a second element. The description may include position information for graphical elements that do not require either absolute or relative positions, such as an array of signals.

The representation arrangement determination component 304 may instead or in addition determine position information for one or more graphical elements that is not represented by the user data using, for example, model data 202. A first graphical element that corresponds to a first signal output by a first component, for example, may be placed left of a second graphical element that corresponds to a second signal output by a second component if the second component processed the first signal as input. If the component includes a first-in-first-out buffer, for example, representation arrangement determination component 304 may determine to display graphical elements that correspond to adjacent bits in the buffer next to each other in the visual representation. Similarly, if the component includes a multiplier circuit, the representation arrangement determination component 304 may determine to position graphical elements that correspond to the inputs to the multiplier above other graphical elements that correspond to the outputs of the multiplier.

A signal selection component 308 may determine which signals (and corresponding values) are to be displayed using graphical elements in the visual description. In some embodiments, the signals are represented in the visual data 204, and the signal selection component 308 processes the visual data 204 to determine the signals. In other embodiments, the signal selection component 308 may determine signals that are not represented in the visual data 204. The visual data 204 may include references to input and output signals of a component, for example, and the signal selection component 308 may select additional signals that are internal to the component. An association determination component 310 may determine, by processing the visual data 204 and/or model data 202, associations between signals and graphical elements. These associations may be represented in the visual data 204 and/or model data 202 (e.g., specified by a user) and/or created by the association determination component 310 if and when the signal selection component 308 selects a signal that is not represented in the visual data 204 or model data 202. A display data determination component 312 may process data determined by one or more of the above-referenced components to determine the visual display data 228 (and/or other data).

A user input component 306 may receive and process user data, such as input from a mouse or keyboard, to thereby change the information represented in the visual representation of the operation of the circuit. This user data may, for example, cause the user input component 306 to cause the display of different levels of hierarchy of the visual representation, as explained in greater detail with reference to FIG. 7A. The user input may, instead or in addition, correspond to a graphical element, and the user input component 306 may cause the simulation display component 224 to display an indication of a corresponding signal represented in the simulation display data and/or cause the model display component 220 to display an indication of a corresponding part of the model to appear in the model display data 226, as shown in FIG. 6B. The user input may, instead or in addition, correspond to a request to change an attribute of one or more graphical elements, such as its position, color, and/or size.

The visual data 204 may include declarative and/or imperative descriptions, and various attributes may be utilized to define aspects of the visual representation. Hypertext markup language (HTML) and scalable vector graphics (SVG) are examples of declarative descriptions in which a hierarchy of graphical elements may be declared to provide a visual representation. The visual descriptions may have visualization attributes that control display of a graphical element. Such attributes include, but are not limited to, the position (2D or 3D) of the corresponding graphical element(s), the layout of replicated instances (vertically stacked, horizontally stacked, offset amount, etc.), layering order, default background color, etc.

Imperative and declarative visual descriptions may be combined to provide procedural evaluation of attributes of the graphical element. For example, a change in signal value may be highlighted by defining an HTML background-color attribute as an imperative function that returns a color based on a comparison of current and previous signal values. Such a function may be reevaluated when the current time changes. In other embodiments, imperative functions are responsible for producing visualization, such as HTML, to contain declarative code blocks, such as embedded HTML.

The graphical elements may access simulation data using signal references. This access may be made through library calls that may be passed a string representation of the signal name and path through the HDL hierarchy to the signal, as well as a time of the value to be returned. Because of the association of visual descriptions with HDL hierarchy, signal references may be relative to the associated elaborated HDL context.

While a graphical element may be associated with a particular time, the graphical element need not be constrained to accessing only signal values at that precise time. The time of the access may be specified as absolute or relative. Graphical elements may instead or in addition represent activity over a window of time, or it may represent the history or future activity.

FIGS. 4A, 4B, 4C, 4D, 4E, and 4F illustrate displaying data representing operation of an electronic circuit according to embodiments of the present disclosure. Referring first to FIG. 4A, model data 402a describes a Boolean AND gate in which x and y are inputs that determines an output. The inputs and outputs are given signal names "sig_a," "sig_b," and "sig_c," respectively. Visualization data 404a includes a list of each signal name and its corresponding association "viz_a," "viz_b," and "viz_c," respectively. The visualization data 404a further includes an assignment of color to signal value—1 for black and 0 for white, as well as a description of the relative positions of the corresponding graphical elements in the form of an arrow shape "→."

FIG. 4B illustrates a visual representation of the operation of the circuit. The visual representation includes three graphical elements 406b, 408b, and 410b, that correspond to the three associated signals of the visualization data 404a. The representation arrangement determination component 304 of the visual display component 222 thus determines to position the two graphical elements 406b, 408b corresponding to the inputs in a vertical line to the left of the graphical element 410b corresponding to the output to thereby form an abstract "arrow" shape in accordance with the position data of the visualization data 404a.

In this example, one input, sig_a=1, while another input, sig_b=0. The value representation determination component 302 thus determines to display a first graphical element 406b with the color associated with binary 1, black, and the other two graphical elements 408b, 410b with the color associated with binary 0, white. A user may thus easily view the display data 420b to determine that the output of the AND gate is inactive but that one input is active, unlike the corresponding waveform display data 422b, which does not include the above-described graphical elements and display of signal values therewith, but merely a series of waveforms.

Similarly, FIG. 4C displays a similar visual representation, but now both inputs=1. The value representation determination component 302 thus determines to display all graphical elements 406c, 408c, 410c as black. Which, again, the corresponding waveform display data 422c does not include the above-described graphical elements and display of signal values therewith, but merely a series of waveforms.

Referring to FIGS. 4D, 4E, and 4F, and referring first to FIG. 4D, model data 432d describes three Boolean OR gates in which w, x, y, and z are inputs and that provides an output. The inputs and outputs are given signal names "sig_a," "sig_b," "sig_c," "sig_d," and "sig_e" respectively. Visualization data 434a includes a list of each signal name and its corresponding association "viz_a," "viz_b," "viz_c," "viz_d," and "viz_e," respectively. The visualization data 434d further includes an assignment of color to signal value—1 for black and 0 for white, as well as a description of the relative positions of the corresponding graphical elements in the form of an arrow shape "→."

FIG. 4E illustrates a visual representation of the operation of the circuit defined by the model data 432d. The visual representation represented by the visualization display data 440a includes five graphical elements 420e, 422e, 424e, 426e, and 434e, that correspond to the five associated signals of the visualization data 434d. The visualization display data 440a also, however, includes representations of two graphical elements 428e, 430e, that are not represented in the visualization data 434d or named in the model data 432a. As mentioned above, the signal selection component 308 may select signals that are not represented in the model data 434a, such as signals associated with intermediate nodes, and determine associations with graphical elements therefor.

As mentioned above with reference to FIG. 4C, the representation arrangement determination component 304 of the visual display component 222 thus determines to position the four graphical elements 420e, 422e, 424e, 426e corresponding to the inputs in a vertical line to the left the intermediate nodes 428e, 430e, which are to the left of the of the graphical element 432e corresponding to the output to thereby form an abstract "arrow" shape in accordance with the position data of the visualization data 434a.

In this example, two inputs, sig_a=1 and sig_c=1. The value representation determination component 302 thus determines to display a first graphical element 420e and a second graphical element 424e with the color associated with binary 1, black. The value representation determination component 302 determines, based on the model data 434d and/or simulation data, that the intermediate graphical elements 428e, 430 are similarly associated with black, as is the output graphical element 432e. A user may thus easily view the display data 440b to determine which of the inputs of the OR gate of the model data 432d are causing the output sig_e to be 1, unlike the corresponding waveform display data 442*d*, which does not include the above-described graphical elements and display of signal values therewith, but merely a series of waveforms.

Similarly, FIG. 4F displays a visual representation, but now only one input sig_d=1. The value representation determination component 302 thus determines to display graphical elements 424*f*, 430*f*, 434*f* as black. Which, again, the corresponding waveform display data 442*f* does not include the above-described graphical elements and display of signal values therewith, but merely a series of waveforms.

FIGS. 5A, 5B, 5C, and 5D illustrate displaying data representing operation of an electronic circuit at least two points in time according to embodiments of the present disclosure. Referring first to FIG. 5A, model data 502*a* includes a representation of three signals, sig_a, sig_b, and sig_c. Visual data 504*a* includes a representation of an association between the signals and associations viz_a, viz_b, and viz_c. Waveform display data 506*a* includes a representation of the values of the signals sig_a, sig_b, and sig_c versus time, in which, at a first time t=1, the first signal sig_a=1, at a second time t=2, the second signal sig_b=1, and at a third time t=3, the third signal sig_c=1.

FIGS. 5B, 5C, and 5C illustrate visual representations of the values of the signals using graphical elements at the various points in time. Referring first to FIG. 5B, the value representation determination component 30 determines that, at the time t=1, a first graphical element 520*b* is associated with the color black to represent the value of sig_a at time t=1. Referring to FIG. 5C, the value representation determination component 30 determines that, at the time t=2, a second graphical element 522*c* is associated with the color black to represent the value of sig_b at time t=2. Similarly, referring to FIG. 5D, the value representation determination component 30 determines that, at the time t=3, a third graphical element 524*c* is associated with the color black to represent the value of sig_c at time t=3.

Each of the visual representations of FIGS. 5B, 5C, and 5D may be displayed independently on the computer display in sequence, such that the visual representation of FIG. 5B is first displayed, the visual representation of FIG. 5C is next displayed, and the visual representation of FIG. 5D is then displayed. The computer display thus displays an animated sequence of the values of the signals sig_a, sig_b, sig_c as defined by the waveform display data 506*a* and as shown by the associated graphical elements. The present disclosure is not limited to the display of only three discrete points in time, and the display of any number of points in time is within the scope of the present invention. In some embodiments, the display of particular points in time and the speed at which the display is changed is determined by user input and/or the user input component 306.

When user input indicates navigation from one time to the next to animate a visual representation, graphical elements of the visual representation may change position or other attributes, such as color, shape, and/or size. In some embodiments, rather than abruptly changing attributes from one value to the next when navigating in increments forward or backward in time, corresponding quantifiable attributes between the two representations can be transitioned over a period of time (on the order of, say, a second). This more-gradual transition may help a user to visually maintain a correlation between corresponding elements with little or no additional burden on the designer.

Figure 6A:
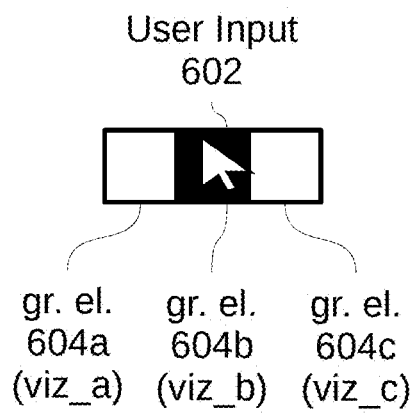
FIGS. 6A and 6B illustrate displaying data representing operation of an electronic circuit in accordance with a user input according to embodiments of the present disclosure.
Figure 6B:
Figure 6B:
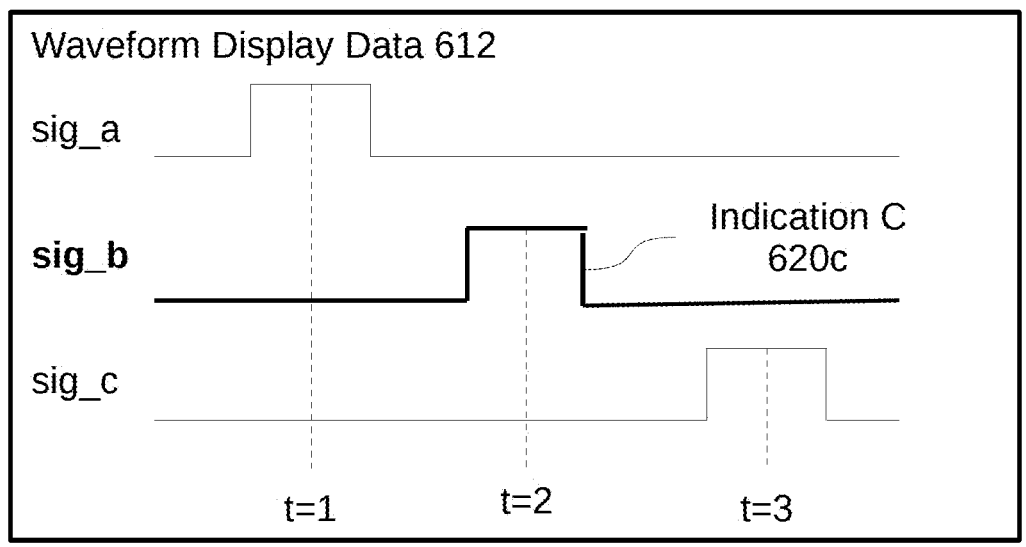

FIGS. 6A and 6B illustrate displaying data representing operation of an electronic circuit in accordance with a user input according to embodiments of the present disclosure.

Referring first to FIG. 6A, a user may indicate, via a user input 602, a particular graphical element 604*b*. The association determination component 310 of the visual display component 222 may determine that one or more other items of data are associated with the graphical element 604*b*, such as a determined portion of the model or simulation, as described above. The visual display component 222 may thus communicate with one or more other display component, such as the model display component 220 and/or the simulation display component 224, to send indication(s) of associated data. For example, with reference to FIG. 6B, the association determination component 310 may cause a first indication A 620*a* to indicate an associated signal in the model data 610*a* and/or cause a second indication B 620*b* to indicate an associated association in the visual data 610*b*. The association determination component 310 may similarly cause a third indication C 620*c* to indicate an associated waveform in the waveform display data.

Figure 7A:
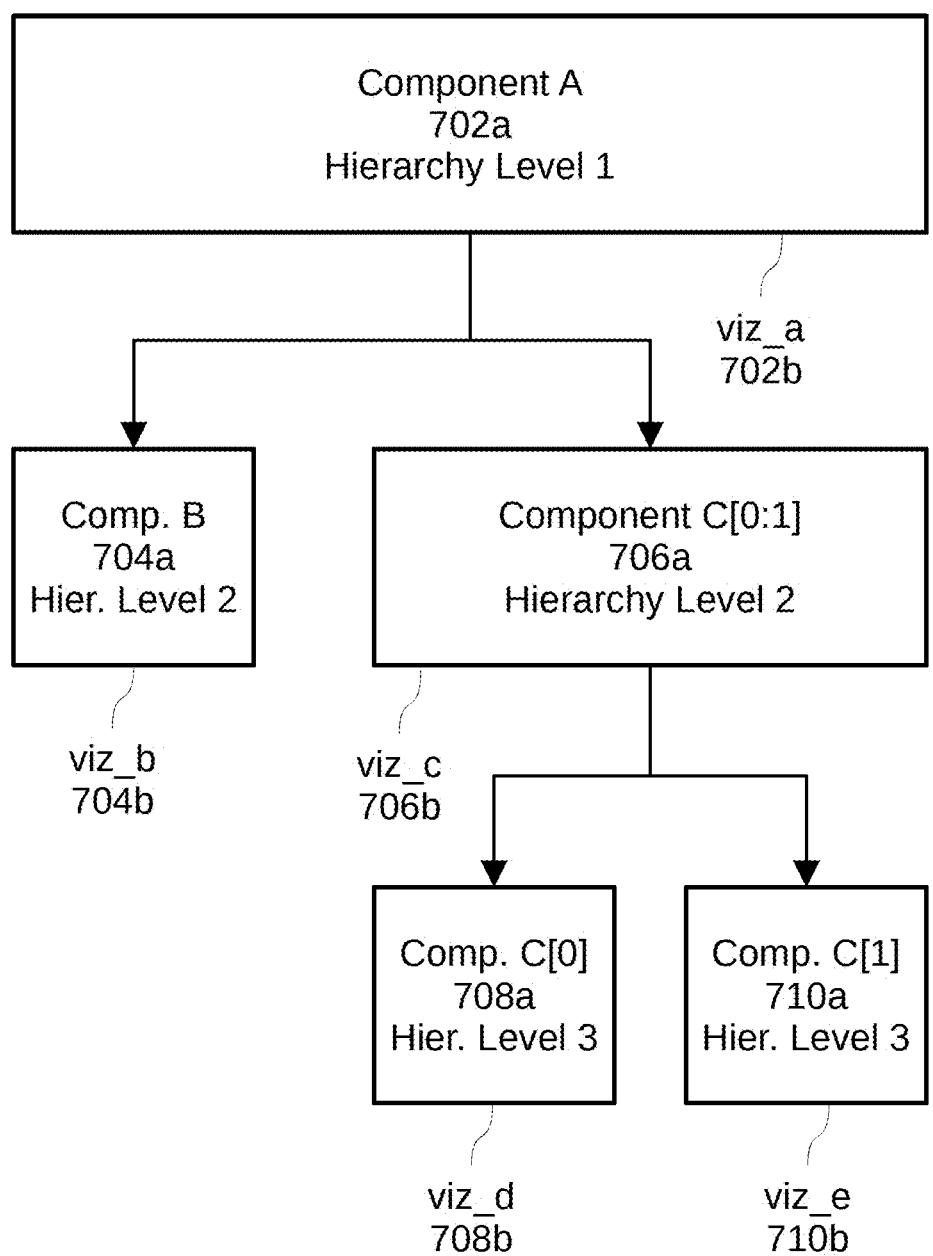
FIGS. 7A and 7B illustrate displaying data representing an electronic circuit at different levels of hierarchy according to embodiments of the present disclosure.
Figure 7B:
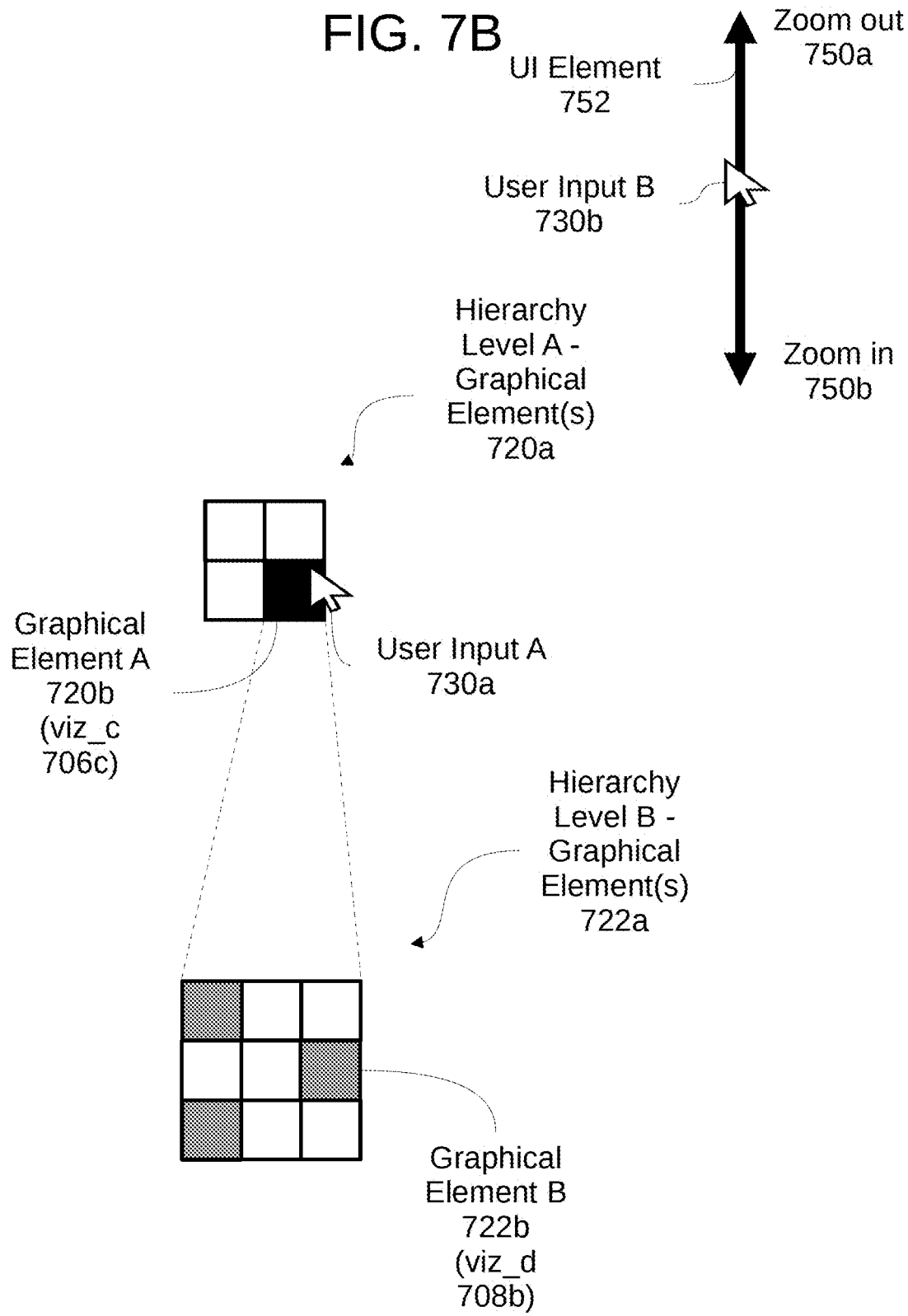

FIGS. 7A and 7B illustrate displaying data representing an electronic circuit at different levels of hierarchy according to embodiments of the present disclosure. Referring first to FIG. 7A, a first component A 702*a* may correspond to a first level of hierarchy; this first component may include at least one signal corresponding to a first association 702*b*. A second component B 704*a* may be part of the first component A 702*a*; this second component B 704*a* may be associated with a second level of hierarchy and may include at least one signal corresponding to a second association 704*b*. A third component C[0:1] 706*a* may be part of the first component A 702*a*; this second component C[0:1] 706*a* may be associated with a second level of hierarchy and may include at least one signal corresponding to a second association 706*b*. As described above with reference to FIG. 2B, a simulator parsing component 206 may flatten the second component C[0:1] 706*a* into a fourth component C[0] 708*a* having a corresponding association 708*b* and a fifth component C[1] 710*a* having a corresponding association 710*b*. The circuit may similarly contain references to one or more modules that may be instantiated by module definitions, which may similarly be associated with graphical elements.

Each of the associations 702*b*, 704*b*, 706*b*, 708*b*, 710*b* may correspond to a single signal in their corresponding components 702*a*, 704*a*, 706*a*, 708*a*, 710*a*, a plurality of signals in their corresponding components 702*a*, 704*a*, 706*a*, 708*a*, 710*a*, and/or the entire level of hierarchy of their corresponding components 702*a*, 704*a*, 706*a*, 708*a*, 710*a*.

Referring to FIG. 7B, the visual representation may include a first representation of first graphical elements 720*a* corresponding to a first level of hierarchy (such as, but not limited to, one of the three levels of hierarchy discussed above with reference to FIG. 7A) or a second representation of second graphical elements 722*a* corresponding to a second level of hierarchy (such as, but not limited to, one of the three levels of hierarchy discussed above with reference to FIG. 7A). User input may be processed by, for example, the user input component 306, to display on the computer display one of the different levels of hierarchy. A first user input A 730*a* may correspond to a particular graphical element 720*b*; the user input component 306 may thus cause the display of a level of higher or lower hierarchy corresponding to the particular graphical element 720*b*. A second user input 730*b* may correspond to a user interface element 752; the user interface element 752 may thus cause display of a level of higher or lower hierarchy not corresponding to a particular graphical element.

Figure 8:
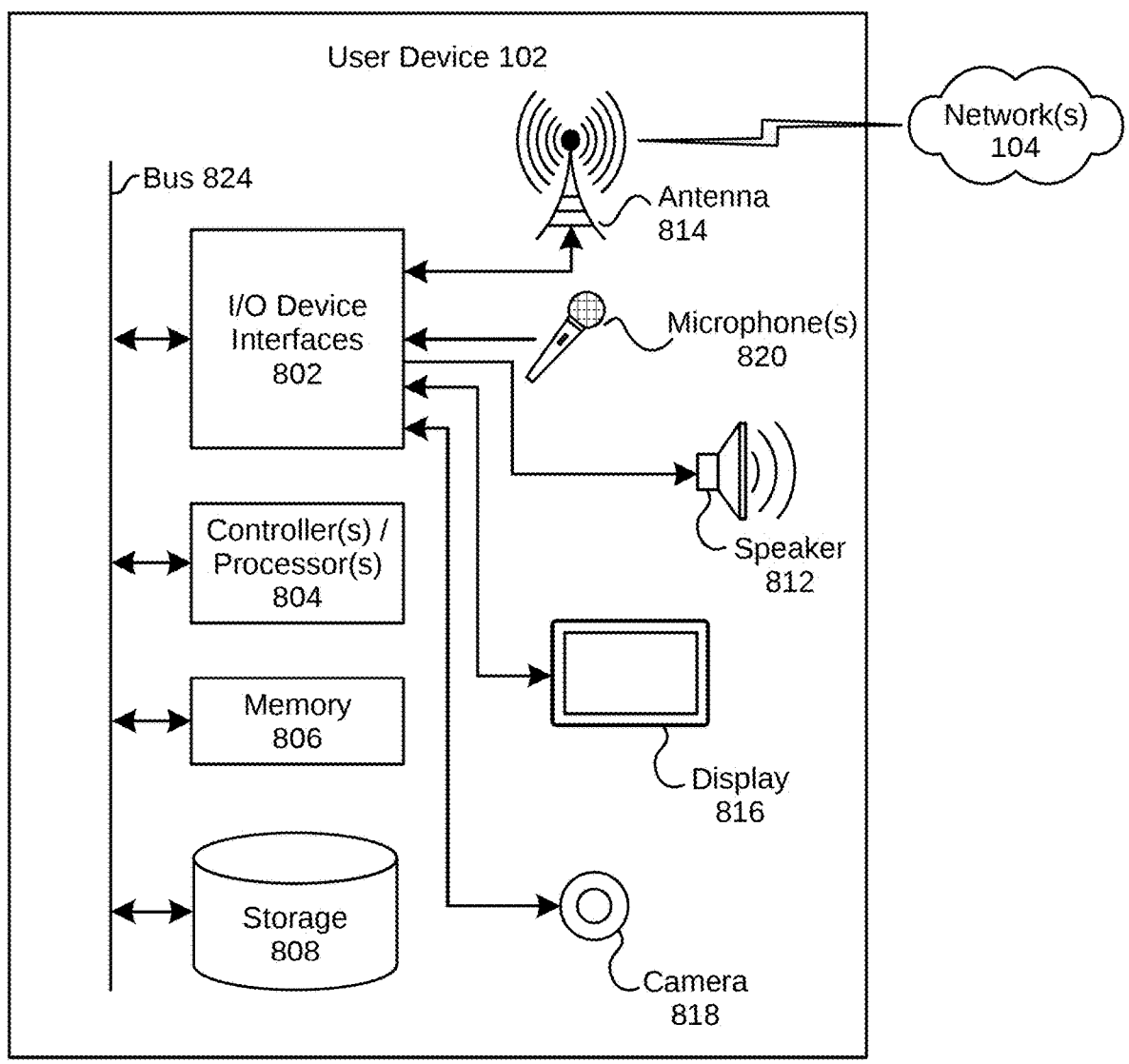
FIGS. 8, 9, and 10 illustrate computers and networks for displaying data representing operation of an electronic circuit according to embodiments of the present disclosure.
Figure 9:
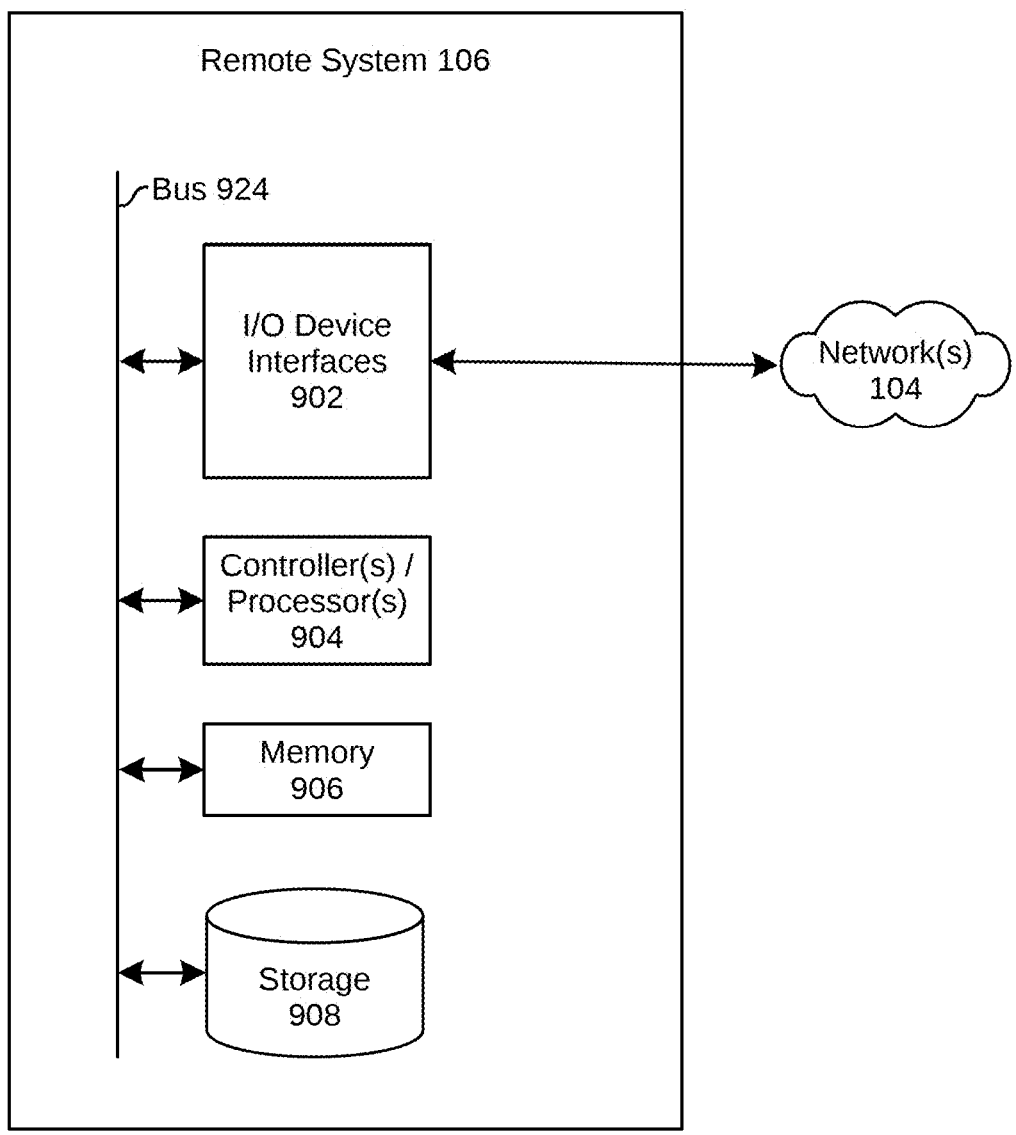

FIG. 8 is a block diagram conceptually illustrating a user device 102. FIG. 9 is a block diagram conceptually illustrating example components of a remote system 106, which may be one or more servers and which may assist with determining and displaying information. The term "system" as used herein may refer to a traditional system as understood in a system/client computing structure but may also refer to a number of different computing components that may assist with the operations discussed herein. For example, a server may include one or more physical computing components (such as a rack system) that are connected to other devices/components either physically or over a network and is capable of performing computing operations. A server may also include one or more virtual machines that emulates a computer system and is run on one or across multiple devices. A server may also include other combinations of hardware, software, firmware, or the like to perform operations discussed herein. The server may be configured to operate using one or more of a client-system model or other computing techniques.

Multiple servers may be included in the system 106, such as one or more servers for displaying operation of an electronic circuit. In operation, each of these server (or groups of devices) may include computer-readable and computer-executable instructions that reside on the respective server, as will be discussed further below. Each of these devices/systems (102/106) may include one or more controllers/processors (804/904), which may each include a central processing unit (CPU) for processing data and computer-readable instructions, and a memory (806/906) for storing data and instructions of the respective device. The memories (806/906) may individually include volatile random access memory (RAM), non-volatile read only memory (ROM), non-volatile magneto-resistive memory (MRAM), or other types of memory. Each device (102/106) may also include a data storage component (808/908) for storing data and controller/processor-executable instructions. Each data storage component (808/908) may individually include one or more non-volatile storage types such as magnetic storage, optical storage, solid-state storage, etc. Each device (102/106) may also be connected to removable or external non-volatile memory or storage (such as a removable memory card, memory key drive, networked storage, etc.) through respective input/output device interfaces (802/902). The user device 102 may further include loudspeaker(s) 812, microphone(s) 820, display(s) 816, or camera(s) 818.

Computer instructions for operating each device/system (102/106) and its various components may be executed by the respective device's controller(s)/processor(s) (804/904), using the memory (806/906) as temporary "working" storage at runtime. A device's computer instructions may be stored in a non-transitory manner in non-volatile memory (806/906), storage (808/908), and/or an external device(s). Alternatively, some or all of the executable instructions may be embedded in hardware or firmware on the respective device in addition to or instead of software.

Each device/system (102/106) includes input/output device interfaces (802/902). A variety of components may be connected through the input/output device interfaces (802/902), as will be discussed further below. Additionally, each device (102/106) may include an address/data bus (824/924) for conveying data among components of the respective device. Each component within a device (102/106) may also be directly connected to other components in addition to (or instead of) being connected to other components across the bus (824/924).

The device 102 may include input/output device interfaces 802 that connect to a variety of components such as an audio output component, a wired headset, or a wireless headset, or other component capable of outputting audio. The device 102 may also include an audio capture component. The audio capture component may be, for example, the microphone 820 or array of microphones, a wired headset, or a wireless headset, etc.

Via antenna(s) 814, the input/output device interfaces 802 may connect to one or more networks 104 via a wireless local area network (WLAN) (such as Wi-Fi) radio, Bluetooth, or wireless network radio, such as a radio capable of communication with a wireless communication network such as a Long Term Evolution (LTE) network, WiMAX network, 3G network, 4G network, 5G network, etc. A wired connection such as Ethernet may also be supported. Through the network(s) 104, the system may be distributed across a networked environment. The I/O device interface (802/902) may also include communication components that allow data to be exchanged between devices such as different physical systems in a collection of systems or other components.

Figure 10:
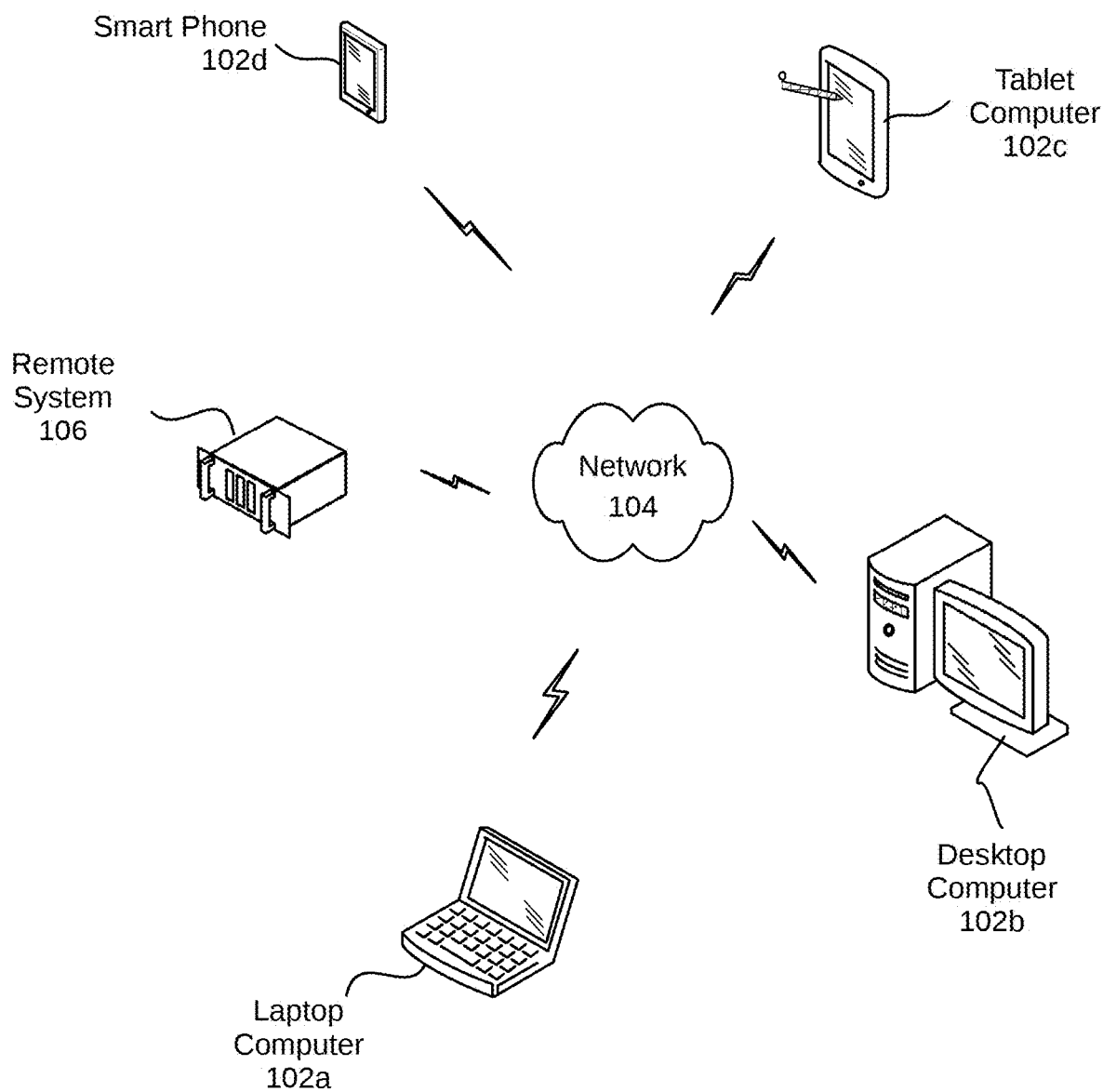

Referring to FIG. 10, as noted above, multiple devices may be employed in a single system. In such a multi-device system, each of the devices may include different components for performing different aspects of the system's processing. The multiple devices may include overlapping components. The components of the device 102 or the system 106, as described herein, are illustrative, and may be located as a stand-alone device or may be included, in whole or in part, as a component of a larger device or system.

The network 104 may further connect a laptop computer 102a, a desktop computer 102b, a tablet computer 102c, and/or a smart phone 102d through a wireless service provider, over a Wi-Fi or cellular network connection, or the like. Other devices may be included as network-connected support devices, such as a remote system 106. The support devices may connect to the network 104 through a wired connection or wireless connection. Networked devices 102 may capture audio using one-or-more built-in or connected microphones or audio-capture devices, with processing performed by components of the same device or another device connected via network 104. The concepts disclosed herein may be applied within a number of different devices and computer systems.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers will understand that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk or other media. In addition, components of one or more of the components and engines may be implemented as in firmware or hardware, such as the acoustic front end, which comprise among other things, analog or digital filters (e.g., filters configured as firmware to a digital signal processor (DSP)).

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements or steps. Thus, such conditional language is not generally intended to imply that features, elements, or steps are in any way required for one or more embodiments or that one or more embodiments necessarily include logic for deciding, with or without other input or prompting, whether these features, elements, or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method for displaying data representing operation of an electronic circuit, the method comprising:
    receiving first data representing the electronic circuit, the first data corresponding to a first representation of a first signal and a second representation of a second signal;
    receiving second data representing the operation, the second data corresponding to a first value of the first signal and a second value of the second signal;
    receiving third data representing at least one user input, the at least one user input corresponding to:
        a first position, in a visual representation, of a first graphical element corresponding to a first shape related to the first signal, and
        a second position, in the visual representation, of a second graphical element corresponding to a second shape related to the second signal;
    determining, based on the first data and the second data, fourth data corresponding to the visual representation, the fourth data representing a first color of the first shape, the first color corresponding to the first value and a second color of the second shape, the second color corresponding to the second value; and
    displaying, on a computer display and based on the third data and the fourth data, the visual representation including the first graphical element at the first position and the second graphical element at the second position.

2. The computer-implemented method of claim 1, further comprising:
    determining an association between the first signal and the first graphical element;
    receiving at least a second user input corresponding to the first graphical element; and
    displaying, based on the association, at least a first portion of the first data corresponding to the first signal or at least a second portion of the second data corresponding to the first signal.

3. The computer-implemented method of claim 1, further comprising:
    determining, using the first data, a first level of hierarchy corresponding to the electronic circuit;
    determining, using the first data, a second level of hierarchy corresponding to the electronic circuit;
    determining to display the first level of hierarchy; and
    displaying a second indication of the first value and the first level of hierarchy.

4. The computer-implemented method of claim 3, further comprising receiving at least a second user input indicating the first level of hierarchy.

5. The computer-implemented method of claim 1, wherein the first data comprises a computer-language description of the electronic circuit.

6. The computer-implemented method of claim 1, wherein the second data comprises an output of a computer simulation corresponding to the electronic circuit.

7. The computer-implemented method of claim 1, further comprising:
    determining, based on the second data and third data, one of the first shape or a size of the first graphical element.

8. The computer-implemented method of claim 1, wherein the first shape is one of a square, rectangle, or circle.

9. The computer-implemented method of claim 1, wherein the first color and the second color are the same color.

10. A system comprising:
    at least one processor; and
    at least one memory including instructions that, when executed by the at least one processor, cause the system to:
        receive first data representing an electronic circuit, the first data corresponding to a first representation of a first signal and a second representation of a second signal;
        receive second data representing operation of the electronic circuit, the second data corresponding to a first value of the first signal and a second value of the second signal;
        receive third data representing a relationship between a first component of the electronic circuit and a second component of the electronic circuit;
        determine, based on the first data and the third data, a first position in a visual representation of the electronic circuit, the visual representation corresponding to a first shape related to the first component and a second position in the visual representation corresponding to a second shape related to the second component;
        determining, based on the first data and the second data, fourth data corresponding to the visual representation, the fourth data representing a first color corresponding to the first shape and a second color corresponding to the second shape; and display, on a computer display and based on the third data and the fourth data, the visual representation including an indication of the first shape at the first position and the second shape at the second position.

11. The system of claim 10, the memory further including instructions that, when executed by the at least one processor, further cause the system to:

determine an association between the first component and the first position;

receive a user input corresponding to the first position; and display, based on the association, at least a first portion of the data corresponding to the first component or at least a second portion of the second data corresponding to the second component.

12. The system of claim 10, the memory further including instructions that, when executed by the at least one processor, further cause the system to:

determine, using the first data, a first level of hierarchy corresponding to the electronic circuit;

determine, using the first data, a second level of hierarchy corresponding to the electronic circuit;

determine to display the first level of hierarchy; and display a second indication of the first value and the first level of hierarchy.

13. The system of claim 12, the memory further including instructions that, when executed by the at least one processor, further cause the system to receive a user input indicating the first level of hierarchy.

14. The system of claim 10, wherein the first data comprises a computer-language description of the electronic circuit.

15. The system of claim 10, wherein the second data comprises an output of a computer simulation corresponding to the electronic circuit.

16. The system of claim 10, the memory further including instructions that, when executed by the at least one processor, further cause the system to:

determine, based on the second data and third data, one of the first shape or size of the first shape.

* * * * *